United States Patent
Jiang et al.

(10) Patent No.: US 10,163,938 B2
(45) Date of Patent: Dec. 25, 2018

(54) ARRAY SUBSTRATE AND MANUFACTURING METHOD THEREOF, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Peng Jiang, Beijing (CN); Maoxiu Zhou, Beijing (CN); Haipeng Yang, Beijing (CN); Ke Dai, Beijing (CN); Yong Jun Yoon, Beijing (CN); Zhangtao Wang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/525,765

(22) PCT Filed: Sep. 23, 2016

(86) PCT No.: PCT/CN2016/099880
§ 371 (c)(1),
(2) Date: May 10, 2017

(87) PCT Pub. No.: WO2017/118105
PCT Pub. Date: Jul. 13, 2017

(65) Prior Publication Data
US 2018/0114796 A1   Apr. 26, 2018

(30) Foreign Application Priority Data
Jan. 4, 2016  (CN) .......................... 2016 1 0005961

(51) Int. Cl.
*H01L 27/12* (2006.01)
*H01L 21/77* (2017.01)

(52) U.S. Cl.
CPC ............ *H01L 27/124* (2013.01); *H01L 21/77* (2013.01); *H01L 27/12* (2013.01); *H01L 27/127* (2013.01);
(Continued)

(58) Field of Classification Search
CPC . H01L 27/124; H01L 27/127; H01L 27/1262; H01L 27/1248; H01L 21/77;
(Continued)

(56) References Cited

U.S. PATENT DOCUMENTS

2004/0263704 A1* 12/2004 Oh ................... G02F 1/136286
349/43
2014/0070242 A1    3/2014 Huang et al.
(Continued)

FOREIGN PATENT DOCUMENTS

CN       1832184 A    9/2006
CN     103219319 A    7/2013
(Continued)

OTHER PUBLICATIONS

Jan. 10, 2018—(CN) First Office Action Appn 201610005961.0 with English Tran.
(Continued)

*Primary Examiner* — Cuong B Nguyen
*Assistant Examiner* — Samuel Park
(74) *Attorney, Agent, or Firm* — Banner & Witcoff, Ltd.

(57) ABSTRACT

An array substrate and a manufacturing method thereof, and a display device are provided. The array substrate includes a plurality of mutually parallel signal lines, an insulating layer located on a layer in which the plurality of signal lines is located and at least one first conductive structure located (Continued)

on the insulating layer. The insulating layer includes at least two first through holes corresponding to the first conductive structure, and the first conductive structure is electrically connected with the signal lines through the at least two first through holes.

11 Claims, 4 Drawing Sheets

(52) U.S. Cl.
CPC ...... *H01L 27/1248* (2013.01); *H01L 27/1262* (2013.01)

(58) Field of Classification Search
CPC ............... H01L 27/12; H01L 27/14603; H01L 27/14605; H01L 27/14609; H01L 27/14812; H01L 27/3248; H01L 2021/775; H01L 27/1214; H01L 27/3232; H01L 51/0076; H01L 27/32–27/326; H01L 51/50–51/5012; H01L 51/525–51/5287; H01L 2227/32–2227/326; H01L 2251/5323–2251/5361; H01L 2924/12044
See application file for complete search history.

(56) References Cited

U.S. PATENT DOCUMENTS

2014/0117370 A1\* 5/2014 Ma .................... H01L 27/124
257/72
2015/0171116 A1\* 6/2015 Okazaki ............. H01L 27/1225
257/43

FOREIGN PATENT DOCUMENTS

| CN | 103296033 A | 9/2013 |
| CN | 104216182 A | 12/2014 |
| CN | 105448935 A | 3/2016 |

OTHER PUBLICATIONS

Jan. 3, 2017—(WO) International Search Report and Written Opinion Appn PCT/CN2016/099880 with English Tran.

\* cited by examiner

ARRAY SUBSTRATE AND MANUFACTURING METHOD THEREOF, AND DISPLAY DEVICE

The application is a U.S. National Phase Entry of International Application No. PCT/CN2016/099880 filed on Sep. 23, 2016, designating the United States of America and claiming priority to Chinese Patent Application No. 201610005961.0, filed Jan. 4, 2016. The present application claims priority to and the benefit of the above-identified applications and the above-identified applications are incorporated by reference herein in their entirety.

TECHNICAL FIELD

Embodiments of the present invention relate to an array substrate and a manufacturing method thereof, and a display device.

BACKGROUND

Generally, as illustrated in FIG. 1, an array substrate of a display device includes a plurality of mutually parallel gate lines 1 and a plurality of mutually parallel data lines 2. A plurality of pixel units 3 are surrounded by the gate lines 1 and the data lines 2. Thin film transistors 4 are disposed at the intersection of the gate lines 1 and the data lines 2. The conduction and disconnection of the thin film transistors 4 are controlled to control the pixel units 3 corresponding to the thin film transistors 4 to display pictures, and then the pictures of the display device can be controlled.

SUMMARY

Embodiments of the present invention provide an array substrate and a manufacturing method thereof, and a display device, which can relief the problem that the display device cannot display pictures normally due to the delay of signals.

At least one embodiment of the present invention provides an array substrate, comprising a plurality of mutually parallel gate lines, an insulating layer on a layer in which the plurality of gate lines and at least one first conductive structure on the insulating layer. The insulating layer is provided with at least two first through holes corresponding to the first conductive structure, and the first conductive structure is electrically connected with the gate lines through the first through holes.

Furthermore, at least one embodiment of the present invention provides a display device which comprises the array substrate as mentioned above.

Furthermore, at least one embodiment of the present invention provides a manufacturing method of the array substrate, the manufacturing method of the array substrate comprising: forming a gate metal layer, and forming a pattern including gate lines by a patterning process; forming an insulating layer on a layer in which the gate lines are located and forming at least two first through holes corresponding to a first conductive structure on the insulating layer by a patterning process; forming a first conducting layer on the insulating layer and forming a pattern including the first conductive structure by a patterning process, and the first conductive structure being electrically connected with the gate lines through the first through hole.

BRIEF DESCRIPTION OF THE DRAWINGS

In order to clearly illustrate the technical solution of the embodiments of the invention or the prior art, the drawings of the embodiments will be briefly described in the following; it is obvious that the drawings in the description are only related to some embodiments of the invention and for those skilled in the art can also obtain other drawings according to these drawings without any inventive work.

DESCRIPTION OF DRAWING SIGNS

0—array substrate; 1—gate line/signal line; 2—data line; 3—pixel unit; 4—thin film translator; 5—insulating layer; 6—first conductive structure; 7—first through hole; 8—source electrode; 9—drain electrode; 10—active layer; 11—etch barrier layer; 12—second through hole; 13—third through hole; 14—passivation layer; 15—second conductive structure; 16—fourth through hole; 17—pixel electrode.

DETAILED DESCRIPTION

In order to make objects, technical details and advantages of the embodiments of the disclosure, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the invention. In addition, the thickness and shape of films in drawings do not reflect the true proportion, and are only schematic illustration of the contents of the invention.

Unless otherwise defined, the technical terminology or scientific terminology used herein should have the general meanings understood by those skills in the art to which the disclosure belongs. The "first", "second" and similar words used in the present disclosure application specification and claims do not mean any sequence, amount or importance, but are merely used to distinguish different components. "Comprise" or "include" or similar words is intended to mean the elements or objects appearing before the "comprise" or "comprising" cover elements, objects or equivalents listed after the "comprise" or "include", while other elements or objects are not exclusive. "Connecting" or "connected" and similar words are not limited to the physical or mechanical connection, but may comprise electrical connection, no matter directly or indirectly.

Figure 1:
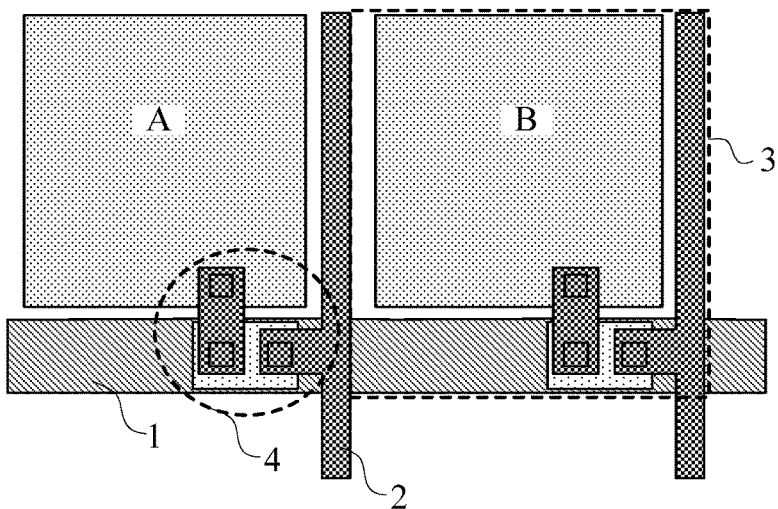
FIG. 1 is a planar structural view of an array substrate.

Generally, as illustrated in FIG. 1, the process of displaying pictures of a pixel unit 3 on position A is: a thin film transistor 4 corresponding to the pixel unit 3 on the position A is turned on upon driving signals of a gate line 1 arriving at the pixel unit 3 on the position A; at the same time, driving signals (data signals) of a data line 2 also arrive at the pixel unit 3 on the position A to load voltage for a pixel electrode of the pixel unit 3 on the position A to drive the pixel unit 3 on the position A to display pictures.

However, the inventors of the application found in the actual research process, as illustrated in FIG. 1, the driving way of the pixel unit 3 is generally scanning a single gate line 1 from left to right and scanning a single data line 2 from top to down, and the gate line 1 of a display device with a large size display screen is longer, therefore, a signal delay is generated in the gate line 1. For example, when the pixel unit 3 on the position A is required to be driven, the driving signals of the gate line 1 is later than the driving signals of the data line 2 to the pixel unit 3 on the position A due to the signal delay of the drive signals of the gate line 1. Therefore, when the driving signals of the gate line 1 reach the pixel unit 3 on the position A, the driving signals of the data line 2 have passed through the pixel unit 3 on the position A, which causes the pixel unit 3 on the position A cannot display the picture normally and then causes the display picture of the display device not complete and appears afterimages.

Embodiments of the present invention provide an array substrate and a manufacturing method thereof, and a display device. The array substrate comprises: a plurality of mutually parallel signal lines, an insulating layer on a layer in which the plurality of signal lines are located and at least one first conductive structure on the insulating layer. The insulating layer comprises at least two first through holes corresponding to the first conductive structure and the first conductive structure is electrically connected with the signal lines through the at least two first through holes. The array substrate can be applied to a display device with a large size display panel and helped to make the display panel including the array substrate to display a complete display picture, and avoid afterimages.

The array substrate and the manufacturing method thereof and the display device provided by the embodiments of the invention are described with reference to the drawings.

First Embodiment

Figure 2:
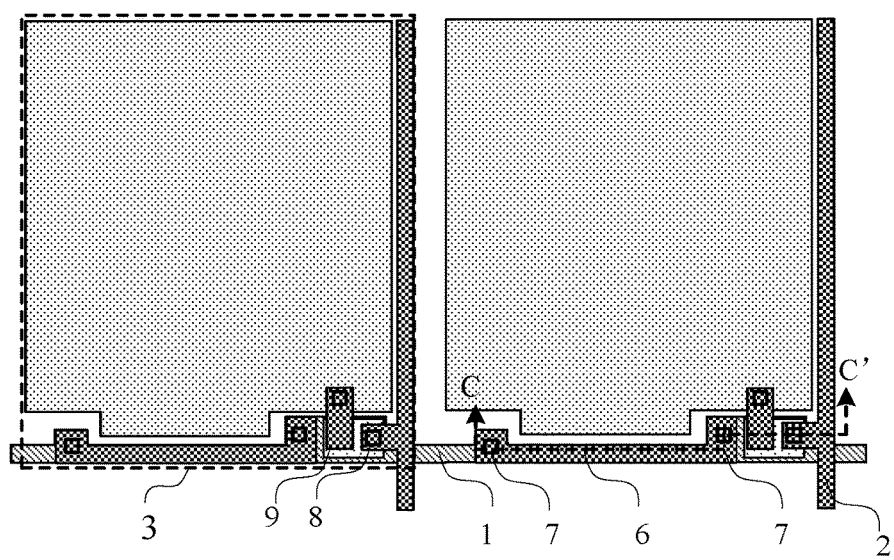
FIG. 2 is a first planar structural view of an array substrate provided by an embodiment of the invention.
Figure 3:
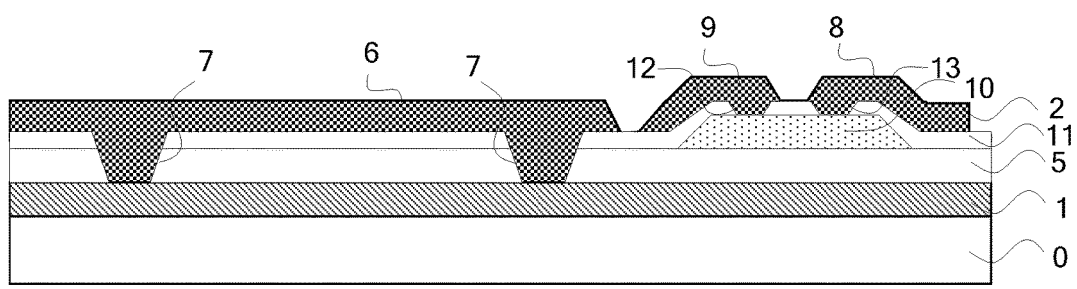
FIG. 3 is a sectional view along the C-C' direction in FIG. 2.

The embodiment provides an array substrate, as illustrated in FIG. 2 and FIG. 3, the array substrate includes a plurality of mutually parallel gate lines 1, further includes an insulating layer 5 on a layer in which the plurality of gate lines 1 is located and at least one first conductive structure 6 on the insulating layer 5. The insulating layer 5 is provided with at least two first through holes 7 corresponding to the first conductive structure 6 and the first conductive structure 6 is electrically connected with the gate lines 1 through the at least two first through holes 7.

In the array substrate provided in the embodiment of the invention, since the first conductive structure 6 is electrically connected with the gate line 1 through the at least two first through holes 7, the first conductive structure 6 is connected in parallel with the gate line 1, which is equivalent to that a resistor is connected in parallel with the gate line 1 to reduce the overall resistance of the whole gate line 1. And the resistance value is proportional to the signal delay time according to the relation between the resistance value and the signal delay time, thereby the signal delay time of the gate line 1 can be reduced by reducing the resistance value of the gate line 1. Compared with the position of the first pixel unit 3, which is not normally displayed in the row position in the usual array substrate (for example, the pixel unit 3 on the position A in FIG. 1), the pixel unit 3 on the position A can be displayed normally in the invention. The signal delay time is reduced due to the resistance value of the gate line 1, by which the signal for the pixel unit 3 on the position A is passed, is reduced. Therefore, the driving signal of the data line 2 can reach the position of the pixel unit 3 on the position A exactly as desired when the driving signal of the gate line 1 reaches the pixel unit 3 on the position A, and then the display pictures of the pixel unit 3 on the position A can be displayed normally. Therefore, compared with the number of the pixel units 3 which cannot display normally in the technical details as illustrated in FIG. 1, the number of the pixel units 3 which cannot display normally in the embodiment of the invention can be reduced obviously. The problem that the display device cannot display pictures normally is relieved in the embodiment of the invention. It should be noted that the embodiment of the invention is described with an example in which the signal lines are gate lines, however, the embodiment of the invention includes but not limited to this, the signal lines can also be data lines or other signal lines. For example, when the size of the display panel using the display array substrate provided by the embodiment is larger or the data lines are longer than the gate lines of the display panel, the signal lines can be data lines.

For example, in the array substrate provided by an example in the embodiment of the present invention, as illustrated in FIG. 2, the first conductive structure 6 has a shape of strip, and the extending direction of the first conductive structure 6 is the same as the extending direction of the gate line 1.

For example, in the array substrate provided by an example in the embodiment of the present invention, as illustrated in FIG. 2, the at least two first through holes 7 are at least disposed on both ends of the first conductive structure 6 in order to improve the utilization efficiency of the first conductive structure 6 and reduce the overall resistance of the whole gate line 1 in the case that the size of the first conductive structure 6 is unchanged.

Figure 4:
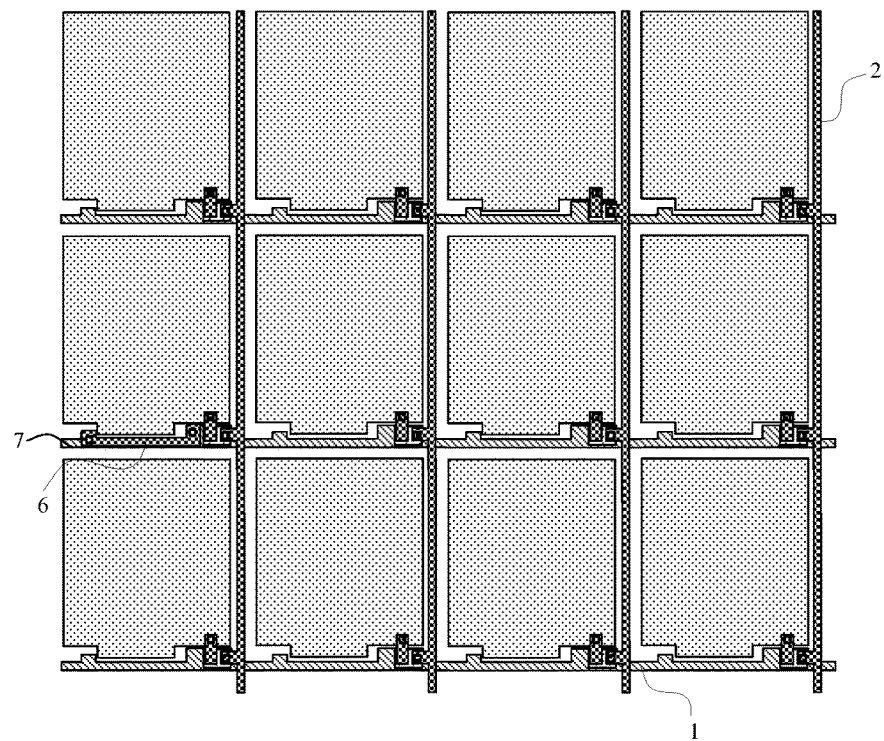
FIG. 4 is a second planar structural view of an array substrate provided by an embodiment of the invention.
Figure 5:
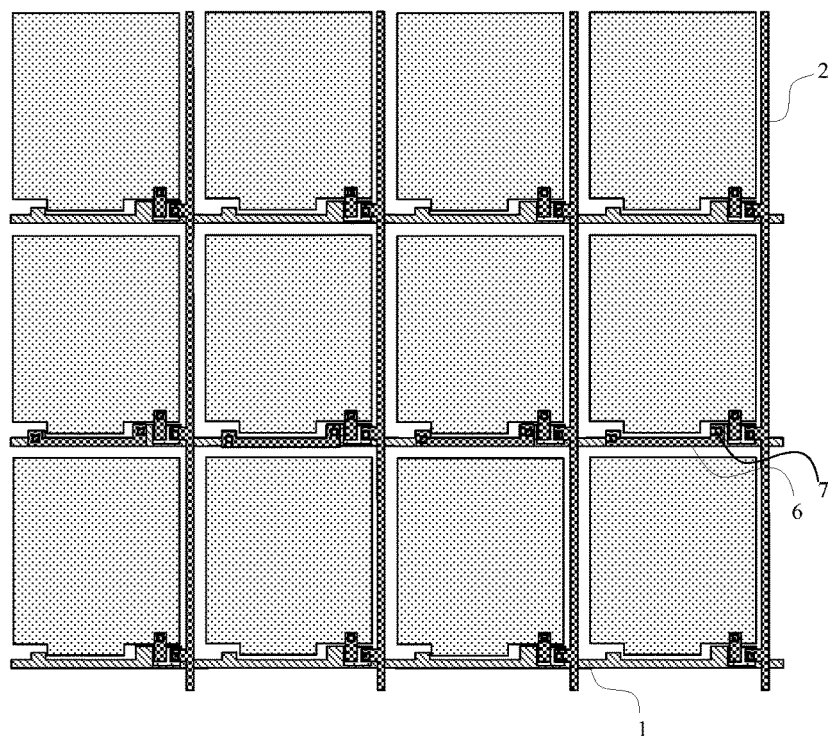
FIG. 5 is a third planar structural view of an array substrate provided by an embodiment of the invention.
Figure 6:
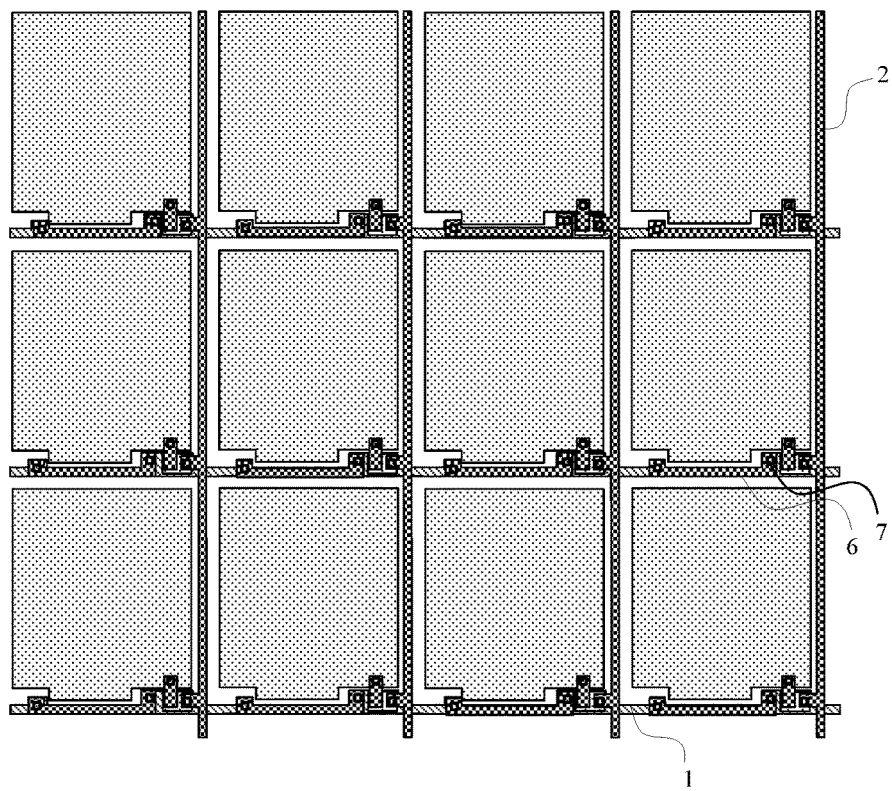
FIG. 6 is a fourth planar structural view of an array substrate provided by an embodiment of the invention.

It should be noted that, "the at least one first conductive structure" may be one first conductive structure 6 or a plurality of the first conductive structures 6. As illustrated in FIG. 4, when the array substrate includes one first conductive structure 6, "the first conductive structure 6 is electrically connected with the gate line 1 through the at least two first through holes 7" may be that the first conductive structure 6 is electrically connected with one gate line 1 of a plurality of gate lines 1 through the first through holes 7. When the array substrate includes a plurality of the first conductive structures 6, "the first conductive structure 6 is electrically connected with the gate line 1 through the at least two first through holes 7" as illustrated in FIG. 5, in the extending direction of the gate line 1, a plurality of the first conductive structures 6 are respectively electrically connected with one gate line 1 of a plurality of gate lines 1 through a plurality of the first through holes 7; or, as illustrated in FIG. 6, a plurality of first conductive structures 6 are divided into a plurality of groups according to the number of the gate lines 1, and each of the groups includes a specific number of the first conductive structures 6. The first conductive structure 6 included in each group corresponding to one gate line 1, and in the direction of extension of the gate line 1, the first conductive structures 6 included in each group are electrically connected with one gate line 1 through a plurality of the first through holes 7, respectively. In addition, "the first conductive structure 6 is electrically connected with the gate line 1 through the at least two first through holes 7" may be other situations, and the other situations are not listed herein. For example, as illustrated in FIG. 6, the first conductive structures 6 included in each group correspond to one gate line 1. In the extending direction of the gate line 1, the first conductive structures 6 included in each group is electrically connected with one gate line 1 through the first through holes 7, respectively. At this time, the resistance of each gate line 1 can be reduced, so as to reduce the signal delay time of each gate line 1, and further reduce the number of the pixel units 3 which cannot be displayed normally. Therefore, the problem that the display device cannot display pictures normally is relieved.

It should also be noted that the insulating layer 5 can be a gate insulating layer or other insulating layer, there is no specifically limited.

For example, as illustrated in FIG. 2, the projection of the first conductive structure 6 on the array substrate (e.g., substrate 0) and the projection of the gate line 1 on the array substrate may be at least partially overlapped. The first through hole 7 disposed in the insulating layer 5 is at least partially located in the overlapping region, and the first conductive structure 6 is electrically connected with the gate line 1 through the at least two first holes 7. In addition, the projection of the first conductive structure 6 on the array substrate and the projection of the gate line 1 on the array substrate can be not overlapped, at this time, for example, the projection of the first conductive structure 6 on the array substrate is just in contact with the projection of the gate line 1 on the array substrate, the first through hole 7 is located at the contact edge of the first conductive structure 6, and a conductive material can be filled in the first through hole 7, therefore, the first conductive structure 6 is in contacted with the edge of the gate line 1 through the conductive material in the first through hole 7 to realize electrical connection. For example, as illustrated in FIG. 2, the projection of the first conductive structure 6 on the array substrate and the projection of the gate line 1 on the array substrate are at least partially overlapped, and the first through hole 7 disposed on the insulating layer 5 is at least partially located in the overlap region. Compared with the situation that the projection of the first conductive structure 6 on the array substrate and the projection of the gate line 1 on the array substrate are not overlapped, the contact area between the first conductive structure 6 and the gate line 1 is larger, therefore, the connection between the first conductive structure 6 and the gate line 1 is more stable.

For example, the projection of the first conductive structure 6 on the array substrate can be located within the projection of the gate line 1 on the array substrate. Since the gate line 1 is located in the light shielding area of the array substrate (for example, covered by a black matrix), the first conductive structure 6 is also located in the light shading area, which does not affect the aperture opening ratio of the display device. In the embodiment mentioned above, as illustrated in FIG. 2 and FIG. 3, the array substrate further includes a thin film transistor, and the thin film transistor includes a source electrode 8 and a drain electrode 9. The source electrode 8 and the drain electrode 9 are disposed on the same layer as the first conductive structure 6 and are not in contact with the first conductive structure 6. Since the source electrode 8 and drain electrode 9 are disposed on the same layer as the first conductive structure 6, they can be formed simultaneously, so that the manufacturing process of the array substrate can be simplified. In addition, the array substrate further includes data lines 2, which are crossed with the gate lines to define the pixel units arranged in sequence. The first conductive structure 6 and the data line 2 are also disposed on the same layer, so they can be formed in the same preparation process, thereby the manufacturing process of the array substrate can be simplified. It should be noted that since the source electrode 8 and drain electrode 9 are not in contact with the first conductive structure 6, and the projection of the first conductive structure 6 on the array substrate is at least partially overlapped with the projection of the gate line 1 on the array substrate, therefore, the first conductive structure 6 is required to be disposed along the direction of the gate line 1 and between the adjacent two drain electrodes 9, that is, the first conductive structure 6 is disposed between the adjacent two pixel units 6 along the direction of the gate line 1.

For example, as illustrated in FIG. 3, in an example, the thin film transistor further includes an active layer 10 and an etch barrier layer 11 located between the insulating layer 5 and the layer in which the source electrode 8 and the drain electrode 9 are located. The etch barrier layer 11 comprises a second through hole 12 corresponding to the source electrode 8 and a third through hole 13 corresponding to the drain electrode 9, the source electrode 8 and the drain electrode 9 are electrically connected with the active layer 10 through the second through hole 12 and the third through hole 13, respectively. Since the active layer 10 is provided with an etch barrier layer 11 thereon, the active layer 10 is not etched when the source electrode 8 and the drain electrode 9 are etched on the active layer 10, so that the performance of the active layer 10 is not affected.

Figure 7:
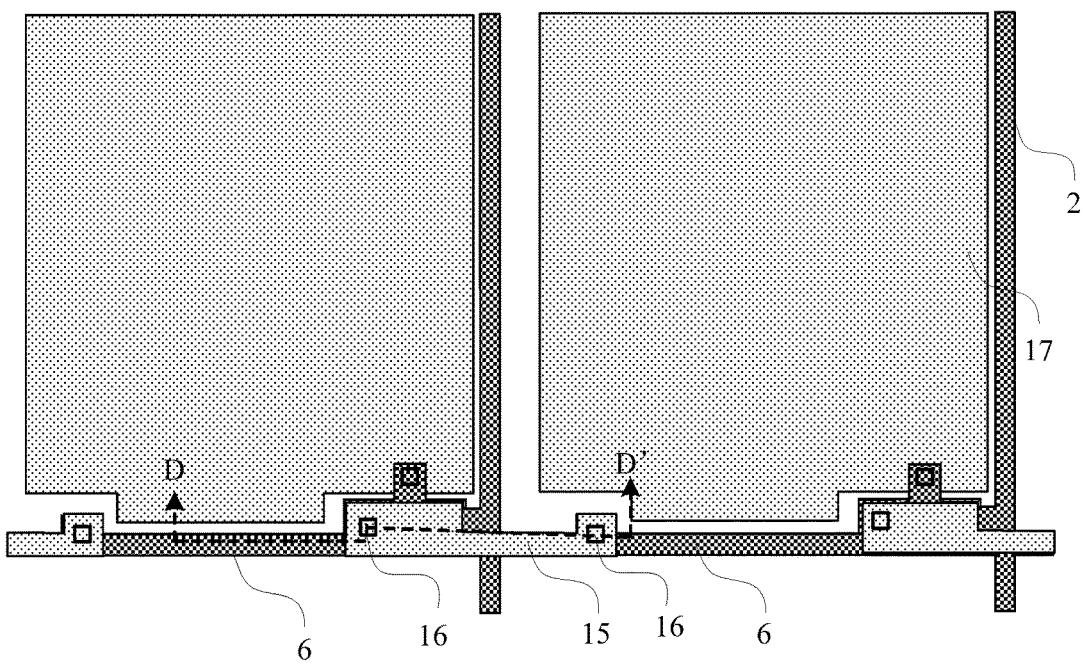
FIG. 7 is a fifth planar structural view of an array substrate provided by an embodiment of the invention.
Figure 8:
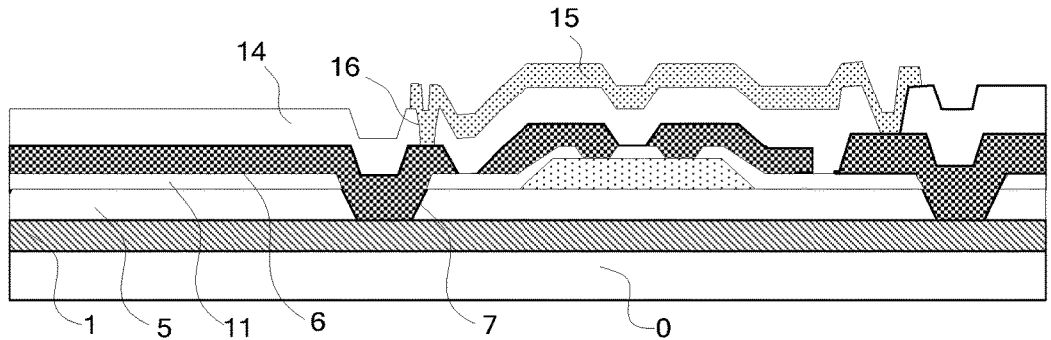
FIG. 8 is a sectional view along the D-D' direction in FIG. 7.

For example, as illustrated in FIG. 7 and FIG. 8, in another example, the array substrate may include a passivation layer 14 located on the layer in which the first conductive structure 6 is located, and at least one second conductive structure 15 located on the passivation layer 14. The passivation layer 14 is provided with at least two fourth through holes 16 corresponding to the second conductive structure 15, and the second conductive structure 15 is electrically connected with the first conductive structure 6 through the at least two fourth through holes 16.

In the array substrate provided in the present embodiment, since the second conductive structure 15 is electrically connected with the first conductive structure 6 through the at least two fourth through holes 16, the second conductive structure 15 is connected in parallel with the structure including the gate line 1 and the first conductive structure 6, which is equivalent to that a resistor is connected in parallel with the structure including the gate line 1 and the first conductive structure 6 to reduce the overall resistance of the whole gate line 1. Based on the beneficial effect of the first conductive structure 6, the second conductive structure 15 can be added to further relief the problem that the display device cannot display pictures normally.

For example, similar to the first conductive structure 6, "the at least one second conductive structure 15" may be one second conductive structure 15 or a plurality of second conductive structures 15. When the array substrate includes one second conductive structure 15, "the second conductive structure 15 is electrically connected with the first conductive structure 6 through the at least two fourth through holes 16" may be that one second conductive structure 15 is electrically connected with one first conductive structure 6 through the at least two fourth through holes 16, or may be that one second conductive structure 15 is electrically connected with a plurality of first conductive structures 6 through the at least two fourth through holes 16.

For example, as illustrated in FIG. 7, in the extending direction of the gate line 1, one second conductive structure 15 is electrically connected with two first conductive structures 6 through two fourth through holes 16, respectively. When the array substrate includes a plurality of second conductive structures 15, "the second conductive structure 15 is electrically connected with the first conductive structure through the at least two fourth through holes 16" may be that in the direction of extension of the gate line 1, each second conductive structure 15 is electrically connected with one first conductive structure 6, respectively; or, as illustrated in FIG. 6, a plurality of first conductive structures 6 is disposed in sequence along the extending direction of the at least one gate line 1. The second conductive structure 15 is located between any two adjacent first conductive structures 6, and the second conductive structure 15 is electrically connected with the two first conductive structures adjacent to the second conductive structure 15 through the two fourth through holes 16, respectively. That is, in the extension direction of the gate line 1, the second conductive structure 15 is connected in series with the first conductive structure 6 through the fourth through holes 16. Furthermore, "the second conductive structure 15 is electrically connected with the first conductive structure through the at least two fourth through holes 16" may be other structures, which are not listed herein. For example, a plurality of the first conductive structures 6 is disposed in interval and in sequence along the extending direction of each gate line 1, the second conductive structure 15 is located between any two adjacent first conductive structures 6, and the second conductive structure 15 is electrically connected with the two first conductive structures adjacent to the second conductive structure 15 through the two fourth through holes 16, respectively. At this point, the first conductive structure 6 and second conductive structure 15 can cover the whole gate line, which is equivalent that each gate line 1 is parallel with multiple resistors. The overall resistance of the gate line is further reduced and the signal delay time of each gate line 1 is reduced, which makes the display device display pictures normally.

For example, as illustrated in FIG. 2 and FIG. 7, the array substrate further includes a plurality of mutually parallel data lines 2, and the data line 2 can be disposed on the same layer as the source electrode 8 and the drain electrode 9. At this point, the data line 2, the source electrode 8 and the drain electrode 9 can be simultaneously formed, so as to simplify the manufacturing process of the array substrate. As illustrated in FIG. 2, the multiple pixel units 3 can be surrounded by the gate lines 1 and the data lines 2, the thin film transistor is disposed in the pixel unit 3, correspondingly, the source electrode 8 and the drain electrode 9 of the thin film transistor are disposed in the pixel unit 3.

For example, as illustrated in FIG. 7, the first conductive structure 6 is also disposed in the pixel unit 3, the first conductive structures 6 correspond to the pixel unit 3 one by one, and the second conductive structure 15 is disposed between any two adjacent pixel units 3. In this design, compared with a plurality of first conductive structures 6 disposed in one pixel unit 3, the first conductive structures 6 correspond to the pixel unit 3, and the process complexity can be reduced. In addition, the second conductive structure 15 is disposed between any two adjacent pixel units 3. The second conductive structure 15 can be connected in parallel at the position of the gate line 1 which is not covered by the first conductive structure 6, so that the whole gate line 1 is connected in parallel with a conductive structure, and then the resistance of the whole gate line 1 can be reduced. Therefore, the design can not only reduce the complexity of the process, but also reduce the resistance of the gate line 1, so that the display device can be normally displayed.

For example, as illustrated in FIG. 7, a projection of the second conductive structure 15 on the array substrate and the projection of the first conductive structure 6 on the array substrate may be at least partially overlapped, the fourth through hole 16 disposed on the passivation layer 14 is located in the overlapping region, and the second conductive structure 15 is electrically connected with the first conductive structure 6 through the fourth through hole 16. In addition, the projection of the second conductive structure 15 on the array substrate and the projection of the first conductive structure 6 on the array substrate can be not overlapped, at this point, the projection of the second conductive structure 15 on the array substrate is just in contact with the projection of the first conductive structure 6 on the array substrate. The fourth through hole 16 is located at the above mentioned contact edge of the second conductive structure 15, conductive material can be filled in the fourth through hole 16, the second conductive structure 15 is in contact with the edge of the first conductive structure 6 through the conductive material in the fourth through hole 16, so as to realize the electrical connection. For example, as illustrated in FIG. 7, the projection of the second conductive structure 15 on the array substrate and the projection of the first conductive structure 6 on the array substrate is at least partially overlapped, compared with that the projection of the second conductive structure 15 on the array substrate and the projection of the first conductive structure 6 on the array substrate are not overlapped, the second conductive structure 15 has a larger contact area with the first conductive structure 6, so that the connection between the second conductive structure 15 and the first conductive structure 6 is more stable.

For example, the array substrate further includes a gate electrode disposed on the same layer as the gate line 1, the projection of the second conductive structure 15 on the array substrate and the projection of the gate electrode on the array substrate may be at least partially overlapped. The mentioned above gate electrode is also included in the thin film transistor. Since the second conductive structure 15 is electrically connected with the first conductive structure 6, the first conductive structure 6 is electrically connected with the gate line 1, the second conductive structure 15 is electrically connected with the gate line 1. In addition, since the gate line 1 is connected with the gate electrode, for example, they are integrally formed, signals loaded on the second conductive structure 15 are the same as that of gate signals loaded on the gate electrode. Furthermore, since the projection of the second conductive structure 15 on the array substrate and the projection of the gate electrode on the array substrate are at least partially overlapped, and in the thin film transistor, the projection of the gate electrode on array substrate and a projection of the active layer 10 on array substrate are overlapped, therefore, the second conductive structure 15 is at least partially overlapped with the active layer 10, which makes it possible that when the gate signals are loaded on the second conductive structure 15 and the gate electrode, the second conductive structure 15 and the gate electrode drive the active layer 10 together, so as to increase the carrier mobility of the active layer 10, and improve the display performance of the display device.

For example, the array substrate may also include a pixel electrode 17 disposed on the passivation layer 14, the second conductive structure 15 and the pixel electrode 17 are disposed on the same layer with the same material. In this design, the second conductive structure 15 and the pixel electrode 17 can be simultaneously formed, so as to simplify the manufacturing process of the array substrate.

For example, since the gate line 1 is connected with the first conductive structure 6 and the second conductive structure 15 in parallel, little increase in the resistance of the gate line 1 will not affect the display effect of the display pictures. Therefore, the width of the gate line 1 can be reduced to for example, a range of 2 μm-10 μm. Compared with the width of the gate line with a width of above 20 μm in the prior art, the width of the gate line 1 can be reduced, so as to improve the aperture opening ratio of the display device.

It should be noted that, as illustrated in FIG. 2, when the width of the gate line 1 is reduced, in order to make electrical connection between the first conductive structure 6 and the gate line 1 more stable, the width of the gate line 1 at the position of the first through hole 7 is wider than that of the other position of the gate line 1. At this point, the size of the first through hole 7 is larger, so as to make the connection between the first conductive structure 6 and the gate line 1 more stable. Similarly, the width of the gate line 1 at the position of the second through hole 16 is wider than that of the gate line 1 at the other positions.

Second Embodiment

The embodiment provides a display device, comprising the provided array substrate by the above mentioned technical details. Since the display device includes the array substrate provided by the above mentioned technical details, the display device has the same beneficial effect as the array substrate in the above technical details, which is not repeated herein.

It should be noted that the display device provided by the embodiment of the invention can be: electronic paper, mobile phone, tablet computer, TV, display, notebook computer, navigators and any other display products or components with the function of displaying.

Third Embodiment

Figure 9:
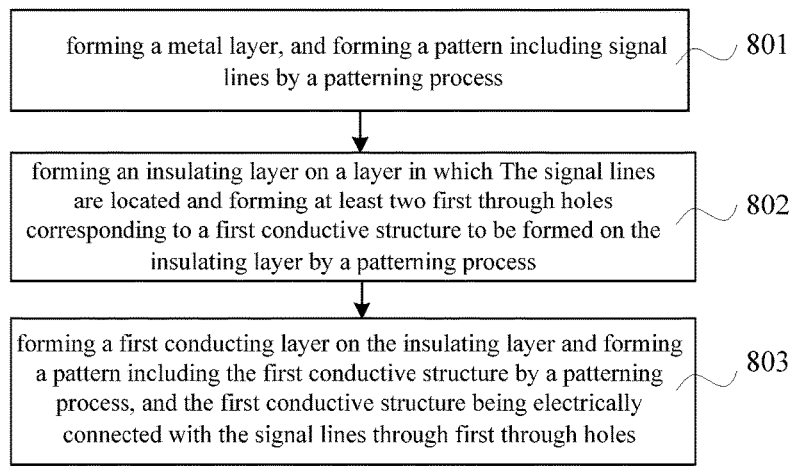
FIG. 9 is a manufacturing process flow chart of an array substrate provided by an embodiment of the invention.

The embodiment also provides a manufacturing method of the array substrate, as illustrated in FIG. 9, the method includes the following steps S801-S803.

S801: forming a metal layer, and forming a pattern including signal lines by a patterning process.

S802: forming an insulating layer on the layer in which the signal lines are located and forming at least two first through holes corresponding to a first conductive structure to be formed in the insulating layer by a patterning process.

S803: forming a first conducting layer on the insulating layer and forming a pattern including the first conductive structure by a patterning process, and the first conductive structure being electrically connected with the signal lines through the at least two first through holes.

The manufacturing method of the array substrate provided by the embodiment of the invention is described in detail by taking an example in which the signal lines are gate lines.

Fourth Embodiment

Figure 10:
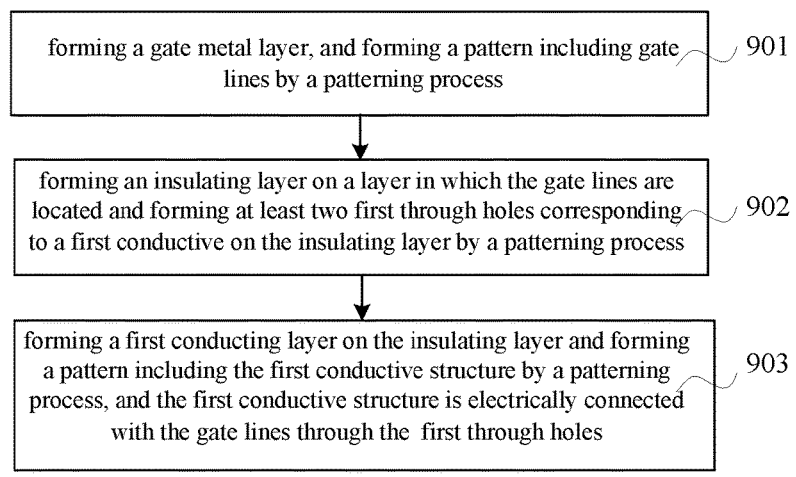
FIG. 10 is another manufacturing process flow chart of an array substrate provided by an embodiment of the invention.

The embodiment of the invention provides a manufacturing method of the array substrate, as illustrated in FIG. 10, the method includes the following steps S901-S903:

S901: forming a gate metal layer, and forming a pattern including gate lines by a patterning process. For example, the gate metal layer is formed by plasma enhanced chemical vapor deposition, sputtering or thermal evaporation, photoresist is applied on the gate metal layer, and the gate metal layer applied with photoresist is covered with a mask plate having a pattern of gate lines, and the pattern including the gate lines is formed after exposure, development and etching.

S902: forming an insulating layer on the layer in which the gate lines are located and forming at least two first through holes corresponding to a first conductive structure (the first conductive structure to be formed) in the insulating layer by a patterning process. For example, an insulating layer is formed on the layer in which the gate lines are located by plasma enhanced chemical vapor deposition, sputtering or thermal evaporation, and at least two first through holes corresponding to a first conductive structure are formed on the insulating layer by a patterning process.

S903: forming a first conducting layer on the insulating layer and forming a pattern including the first conductive structure by a patterning process, and the first conductive structure is electrically connected with the gate lines through the at least two first through holes. For example, the first conducting layer is formed by plasma enhanced chemical vapor deposition, sputtering or thermal evaporation, photoresist is applied on the first conducting layer, and the first conductive layer applied with photoresist is covered with a mask plate having a pattern of the first conductive structure, and the pattern including the first conductive structure is formed after exposure, development and etching.

Since the first conductive structure is electrically connected with the gate line through the at least two first through holes, the first conductive structure is connected in parallel with the gate line, which is equivalent to that a resistor is connected in parallel with the gate line to reduce the overall resistance of the whole gate line. And the resistance value is proportional to the signal delay time according to the relation between the resistance value and the signal delay time, thereby the signal delay time of the gate line can be reduced by reducing the resistance value of the gate line. The partial pixel units that may not be displayed normally in the technical details illustrated in FIG. 1 are displayed normally. Compared with the number of the pixel units which cannot display normally in the technical details as illustrated in FIG. 1, the number of the pixel units which cannot display normally in the embodiment of the invention can be reduced obviously. The problem that the display device cannot display pictures normally is improved in the embodiment of the invention. It should be noted that the embodiment of the invention is described by taking an example in which the signal lines are gate lines, however, the embodiment of the invention includes but not limited to this, the signal lines can also be data lines or other signal lines. For example, when the size of the display panel using the display array substrate provided by the embodiment is larger or the data lines are longer than the gate lines of the display panel, the signal lines can be data lines.

In the embodiment mentioned above, before the step of S903, the manufacturing method of the array substrate further includes: forming a film of active layer on the insulating layer, and forming a pattern including the active layer by a patterning process; forming an etch barrier layer on the layer in which the active layer is located, and forming a second through hole corresponding to a source electrode (the source electrode to be formed) and forming a third through hole corresponding to a drain electrode (the drain electrode to be formed) on the etch barrier layer by a patterning process; a pattern of the first conductive structure and a pattern of the source electrode and the drain electrode are formed simultaneously by one patterning process. The source electrode and the drain electrode are electrically connected with the active layer through the second through hole and the third through hole.

In the embodiment mentioned above, after the step of S903, the manufacturing method of the array substrate further includes: forming a passivation layer on the layer in which the first conductive structure is located, and forming at least two fourth though holes corresponding to the second conductive structure (the second conductive structure to be formed) by a patterning process. For example, the passivation layer is formed on the layer in which the first conductive structure is located by plasma enhanced chemical vapor deposition, sputtering or thermal evaporation, and at least two fourth through holes corresponding to the second conductive structure is formed in the passivation layer by a patterning process; a second conductive layer is formed on the passivation layer, a pattern including the second conductive structure is formed by a patterning process, and the second conductive structure is electrically connected with the first conductive structure through the fourth through holes. For example, a second conducting layer is formed by plasma enhanced chemical vapor deposition, sputtering or thermal evaporation, photoresist is applied on the second conducting layer, and the gate electrode layer applied with photoresist is covered with a mask plate having a pattern of the second conductive structure, and the pattern including the second conductive structure is formed after exposure, development and etching.

Since the second conductive structure is electrically connected with the gate line through the at least two fourth through holes, the second conductive structure is connected in parallel with the structure including the gate line and the first conductive structure, which is equivalent to that a resistor is connected in parallel with the structure including the gate line and the first conductive structure to reduce the overall resistance of the whole gate line. It can be known that formation of the second conductive structure allows the display device to display pictures normally by referring the beneficial effect of the manufacturing method of the first conductive structure.

In the embodiment mentioned above, at the same time of forming the gate line, the manufacturing method of the array substrate further includes: forming a gate electrode, a projection of the second conductive structure on the array substrate is at least partially overlapped with a projection of the gate electrode on the array substrate. In this design, the second conductive structure and the gate electrode drive the active layer together, so as to increase the carrier mobility in the active layer and improve the display performance of the display device.

Each embodiment in this specification is described in a progressive manner, the similar parts of each embodiment can be seen from each other, and each embodiment focuses on the differences with other embodiments. In particular, for method embodiments, since they are basically similar to the product embodiments, it is relatively simple to describe, and the partial description of the product examples can be referred to with respect to the similar parts in the method embodiments.

The foregoing are only some specific embodiments of the invention, and the protection scope of the invention is not limited thereto. In the protection scope of the invention, other variation or alternation can be easily conceived for those skilled in the art, and they should be encompassed in the protection scope of the invention. Therefore, the protection scope of the invention is defined by the claims.

The application claims priority to the Chinese patent application No. 201610005961.0, filed Jan. 4, 2016, the entire disclosure of which is incorporated herein by reference as part of the present application.

What is claimed is:

1. An array substrate, comprising:
a plurality of mutually parallel signal lines;
an insulating layer on a layer in which the plurality of the signal lines is located; and
at least one first conductive structure on the insulating layer,
wherein, the insulating layer is provided with at least two first through holes corresponding to the first conductive structure, and the first conductive structure is electrically connected with the signal lines through the at least two first through holes, and
wherein the signal lines comprise gate lines, the first conductive structure has a shape of a strip, and an extending direction of the first conductive structure is the same as an extending direction of the gate lines;
wherein, the array substrate further comprises a passivation layer on a layer in which the first conductive structure is located, and at least one second conductive structure located on the passivation layer, the passivation layer is provided with at least two fourth through holes corresponding to the second conductive structure, and the second conductive structure is electrically connected with the first conductive structure through the at least two fourth through holes;
wherein, the array substrate further comprises a plurality of mutually parallel data lines, the gate lines and the data lines define a plurality of pixel units, each of the first conductive structures is disposed in each of the pixel units, and the first conductive structures correspond to the pixel units one by one, and the second conductive structure is disposed between any two adjacent pixel units.

2. The array substrate according to claim 1, wherein, the at least two first through holes are at least disposed on both ends of the first conductive structure.

3. The array substrate according to claim 1, wherein, a projection of the first conductive structure on the array substrate and a projection of the gate lines on the array substrate are at least partially overlapped, and the first through holes are located in an overlapping region.

4. The array substrate according to claim 1, wherein, the array substrate further comprises a thin film transistor, the thin film transistor includes a source electrode and a drain electrode, the source electrode and the drain electrode are disposed on the same layer as the first conductive structure and are not in contact with the first conductive structure.

5. The array substrate according to claim 4, wherein, the thin film transistor further includes an active layer and an etch barrier layer located between the insulating layer and a layer in which the source electrode and the drain electrode are located, the etch barrier layer is provided with a second through hole corresponding to the source electrode and a third through hole corresponding to the drain electrode, the source electrode and the drain electrode are electrically connected with the active layer through the second through hole and the third through hole, respectively.

6. The array substrate according to claim 1, wherein, in the extending direction of the gate lines, a plurality of first conductive structures is disposed in interval and in sequence, the second conductive structure is located between any two adjacent first conductive structures, and the second conductive structure is electrically connected with two first conductive structures adjacent to the second conductive structure through the two fourth through holes, respectively.

7. The array substrate according to claim 1, wherein, a projection of the second conductive structure on the array substrate and a projection of the gate lines on the array substrate are at least partially overlapped, the at least two fourth through holes are located in an overlapping region.

8. The array substrate according to claim 1, wherein, the array substrate further comprises a gate electrode disposed on the same layer as the gate lines, a projection of the second conductive structure on the array substrate and a projection of the gate electrode on the array substrate are at least partially overlapped.

9. The array substrate according to claim 1, wherein, the array substrate further comprises a pixel electrode disposed on the passivation layer, and the second conductive structure and the pixel electrode are disposed on a same layer with a same material.

10. The array substrate according to claim 1, wherein, each of the gate lines has a width in a range of 2 μm-10 μm.

11. A display device, comprising the array substrate according to claim 1.

* * * * *